United States Patent

Ohno et al.

[11] Patent Number: 6,166,432
[45] Date of Patent: Dec. 26, 2000

[54] SUBSTRATE FOR USE IN WAFER ATTRACTING APPARATUS AND MANUFACTURING METHOD THEREOF

[75] Inventors: Masashi Ohno, Nagoya; Naohito Yamada, Kasugai; Takahiro Inoue, Gifu; Kouji Kato, Nagoya, all of Japan

[73] Assignee: NGK Insulators, Ltd., Japan

[21] Appl. No.: 09/034,021

[22] Filed: Mar. 2, 1998

[30] Foreign Application Priority Data

Mar. 6, 1997 [JP] Japan ..................................... 9-067478

[51] Int. Cl.⁷ ......................... H01L 23/053; H01L 23/12
[52] U.S. Cl. ........................... 257/701; 361/234; 279/128
[58] Field of Search ........................... 251/701; 361/234; 279/128

[56] References Cited

U.S. PATENT DOCUMENTS

| | | | |
|---|---|---|---|
| 5,514,243 | 5/1996 | Matsuda et al. | 158/345 |
| 5,600,530 | 2/1997 | Smith . | |
| 5,715,132 | 2/1998 | Steger et al. . | |
| 5,846,595 | 12/1998 | Sun et al. . | |
| 5,880,924 | 3/1999 | Kumar et al. . | |
| 6,001,760 | 12/1999 | Katsuda . | |

FOREIGN PATENT DOCUMENTS

| | | |
|---|---|---|
| 0 806 798 A2 | 11/1997 | European Pat. Off. . |
| 7-246336 | 9/1995 | Japan . |
| 8-055900 | 2/1996 | Japan . |

OTHER PUBLICATIONS

Patents Abstracts of Japan, vol. 1997, No. 12, Dec. 25, 1997 & JP 09 213774 A, Aug. 15, 1997 Abstract.
Patent Abstract of Japan, vol. 1996, No. 03, Mar. 29, 1996 & JP 07 297265 A, Nov. 10, 1995.
"Low voltage and High Speed Operating Electrostatic Wafer Chuck Using Sputtered Tantallian Oxide membrane", Mamoru Nakasuji et al., Journal of vacuum Science and Technology: Part A, US American Institute of Physics, N.Y., vol. 12, No. 5, pp. 2834–2839.

*Primary Examiner*—Sheila V. Clark
*Attorney, Agent, or Firm*—Parkhurst & Wendel, LLP

[57] ABSTRACT

A wafer attracting apparatus includes a substrate made of a ceramic material and adapted to attract and hold a wafer onto an attracting surface thereof, wherein the attracting surface is constituted by a ductile worked surface, the ductile worked surface has concave portions, a diameter of each of the concave portions is 0.1 $\mu$m or less, and when the wafer is attracted onto the attracting surface of the substrate and released therefrom, the number of particles attaching to that wafer is 9.3 or less per 1 $cm^2$.

12 Claims, 4 Drawing Sheets

SUBSTRATE FOR USE IN WAFER ATTRACTING APPARATUS AND MANUFACTURING METHOD THEREOF

BACKGROUND OF THE INVENTION

1. Field of the Invention

The present invention relates to a substrate for use in an apparatus for attracting a wafer such as a semiconductor wafer and a manufacturing method thereof.

2. Description of the Related Art

Electrostatic chuck are currently used to attract and hold semiconductor wafers in conveying, exposing, film-forming such as CVD (Chemical Vapor Deposition) and sputtering, micro processing, cleaning, etching or dicing the semiconductor wafers. Attention has been much paid to dense ceramics as materials for such electrostatic chucks. Particularly in the semiconductor manufacturing apparatus, a halogenated corrosive gas such as $ClF_3$ is often used as an etching gas or a cleaning gas. It is desired that the substrate or susceptor for the electrostatic chuck has high thermal conductivity in order to rapidly heat and cool the semiconductor wafer while holding it. It is further desired that the substrate has such thermal shock resistance as to be broken due to rapid temperature change. For example, dense aluminum nitride and dense alumina are considered promising, because they have good corrosion resistance to the above-stated haloganated corrosive gas and thermal shock resistance.

In the semiconductor manufacturing apparatus, it is necessary to prevent the production of particles which would cause defects in semiconductors. In the actual semiconductor manufacturing apparatus, the semiconductor wafer is attracted and held at its back face by the electrostatic chuck. At that time, particles occur on the back surface side of the semiconductor wafer. If a large amount of particles occur, they spread over the front surface of the semiconductor wafer and into a chamber. As a result, the chamber is contaminated, so that semiconductor failure might occur on surfaces of other semiconductor wafers.

To prevent this problem, there have been proposed the following techniques. When the attracting surface of the ceramic electrostatic chuck comes in contact with a silicon wafer, the uneven attracting surface of the electrostatic chuck contacts with the silicon, and rubs off a part of the silicon having relatively low hardness to produce particles. Considering this, fine protrusions on the attracting surface of the electrostatic chuck are rounded by applying plasma onto this attracting surface, thereby preventing the silicon from being rubbed off and consequently decreasing the number of particles (Japanese Unexamined Patent Application Laid-open No. 7-245336).

According to Japanese Unexamined Patent Application Laid-open No. 8-55900, when a silicon wafer is to be attracted to the electrostatic chuck, voltage to be applied to the electrostatic chuck is gradually increased, thereby to mitigate any shock caused through the contact of the silicon wafer with the chuck. By so doing, the damage to the silicon wafer is suppressed, and the number of particles resulting from silicon wafer having been rubbed off is decreased.

The present inventors have been continuing the study to decrease the number of particles adhering to the back surface of a semiconductor wafer after the wafer has been attracted by the electrostatic chuck. According to prior art stated above, it is possible to decrease the number of particles down to for example, few to several thousands per 8-inch wafer. However, to further improve the yield of the semiconductor wafers in the semiconductor manufacturing process and to cope with more micro-structured semiconductors, it is required to decrease the number of particles furthermore. It has been desired, for example, to decrease the number of particles to a few to several hundreds per 8-inch wafer.

SUMMARY OF THE INVENTION

It is therefore an object of the present invention to considerably decrease the number of particles adhering to the back surface of the wafer after the wafer has been attracted to a ceramic substrate of a wafer attracting apparatus.

The present invention relates to a substrate for use in a wafer attracting apparatus which comprises a substrate made of a ceramic material and adapted to attract and hold a wafer onto an attracting surface thereof, wherein said attracting surface is constituted by a ductile worked surface, the ductile worked surface has concave portions, a diameter of each of the concave portions is 0.1 μm or less, and when the wafer is attracted onto the attracting surface of the substrate and released from the attracting surface, the number of particles adhering to that wafer is 9.3 or less per 1 $cm^2$. The measurement of the particles adhering to the wafer is effected in the present invention under the following condition, that is, at an attracting force of 50 $g/cm^2$ at room temperature in clean air. The ductile working is a working which effects working such as polishing of particles themselves at the surface of the substrate without peeling off such particles themselves from the attracting surface of the substrate.

The present invention also relates to a wafer attracting apparatus which comprises a substrate made of a ceramic material and adapted to attract and hold a wafer onto an attracting surface thereof, wherein said attracting surface is constituted by a ductile worked surface having a center line surface roughness height Ra of 0.05 μm or less formed by etching, vertical steps are formed among ceramic particles exposed outside at the attracting surface is 0.5 μm or less, and when the wafer is attracted onto the attracting surface of the substrate, the number of particles adhering to that wafer is 9.3 or less per 1 $cm^2$.

The present invention further relates to a method for manufacturing a wafer attracting apparatus having a substrate made of a ceramic material and adapted to attract and hold a wafer on an attracting surface of the substrate, said method comprising the steps of: converting the attracting surface of the substrate to a ductile worked surface, cleaning the ductile-worked attracting surface by a cleaning member in a high purity cleaning agent while rubbing the attracting surface of the substrate with the cleaning member, and conducting an ultrasonically cleaning for the attracting surface in the high purity cleaning agent. The term "rubbing" means that the attracting surface of the substrate is rubbed with the cleaning member, while the attracting surface is not substantially damaged thereby.

The present invention further relates to a method for manufacturing a wafer attracting apparatus having a substrate made of a ceramic material and adapted to attract and hold a wafer on an attracting surface of the substrate, said method comprising the steps of: converting the attracting surface of the substrate to a ductile worked surface having a center line surface roughness height of Ra=0.05 μm, cleaning the ductile-worked attracting surface by a cleaning member in a high purity cleaning agent while rubbing the attracting surface of the substrate with the cleaning member, and conducting an ultrasonically cleaning for the attracting surface in the high purity cleaning agent.

The present invention further relates to a wafer attracting apparatus which comprises a substrate made of a ceramic material and adapted to attract and hold a wafer onto an attracting surface thereof, wherein said attracting surface is constituted by a ductile worked surface, and when the wafer is attracted onto the attracting surface of the substrate, a maximum roughness Rmax of the ductile worked surface of the substrate is 0.1 μm or less, and the number of particles adhering to that wafer is 9.3 or less per 1 cm².

The present inventors have conducted a detailed study as to particles generated after the semiconductor wafer was attracted and held by the ceramic electrostatic chuck. As a result, the inventors made discoveries as follows. Specifically, the mirror finished surface of an 8-inch silicon wafer was mounted and attracted onto an attracting surface of an aluminum nitride electrostatic chuck. Thereafter, the number of particles on the mirror finished surface of the silicon wafer was measured to be 90,000 or more particles.

Figure 1:
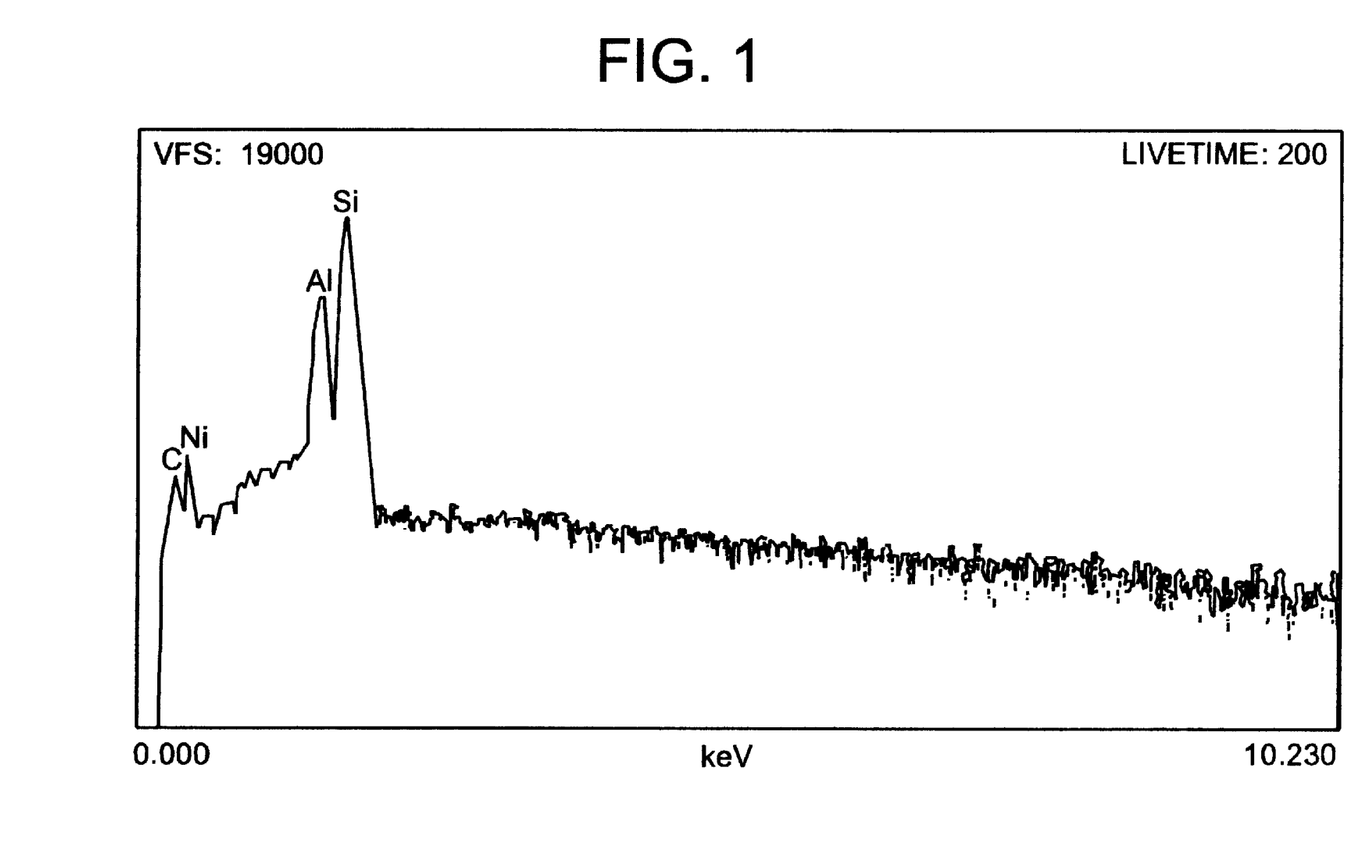
FIG. 1 is a graph showing a result of an elemental analysis for particles on the silicon wafer.

Next, those particles were subjected to elemental analysis, thereby obtaining an analysis result shown in FIG. 1 where peaks of aluminum, silicon, nitrogen and carbon are observed. It is highly noted that the aluminum peak is particularly quite high. The peak of the silicon is also high. However, since the elemental analysis was conducted while particles were present on the silicon wafer, it is presumed that the peak of the silicon almost is attributable to the silicon in the wafer.

This fact contradicts the conventional assumption that particles are produced when the back surface of the silicon wafer is chipped through the shock occurring through contact between the attracting surface of the ceramic electrostatic chuck and the silicon wafer. Rather, this indicates that a main cause of the particle generation lies in the attracting surface of the electrostatic chuck.

It is not clear why particles occur on the attracting surface of the ceramic electrostatic chuck. The attracting surface of the chuck is normally flattened by grinding process. However, it is considered that fine ground pieces are generated during ordinary grinding which makes the attracting surface of the electrostatic chuck flat, and that the resulting fine ground pieces are retained in very small concave portions at the attracting surface or fixedly attached to the attracting surface.

Based upon that discovery, the present inventors cleaned attracting surfaces of electrostatic chucks in various ways. As a result, the inventors succeeded in greatly decreasing the number of particles adhering to the back surface of the semiconductor wafer to 3000 or less per a back surface of an 8-inch wafer (per 324 cm²) (that is, 9.3 or less per 1 cm²) and further to 1000 or less per a back surface of an 8-inch wafer (per 324 cm²) (that is, 3.1 or less per 1 cm²) by the steps of mirror-finishing the attracting surface to a ductile worked surface through lapping or like, cleaning the attracting surface by using a cleaning member in a high purity cleaning agent while contacting the attracting surface with the cleaning member, and then ultrasonically cleaning the attracting surface of the chuck in pure water.

More specifically, the attracting surface of the ceramic substrate is mirror-finished to a ductile worked surface by lapping or the like until the center line average surface roughness height Ra preferably becomes 0.1 μm or less. In this state, no further ceramic particles will be peeled off. Although small holes of 0.1 μm or less in diameter still remain on the ductile worked surface in this state, no holes of 0.1 μm or more in diameter substantially exist. In other words, the diameters of the concave portions remaining on the ductile worked surface are 0.1 μm or less. Neither ceramic grains or their fragmental particles enter these small holes. None of them adhere to the semiconductor wafer.

In the present invention, that the diameters of the concave portions existing on the ductile surface are 0.1 μm or less or that none of holes of 0.1 μm or more in diameter substantially exist means that the number of holes of 0.1 μm or more in diameter is five or less within a dimensional range of 50 μm×70 μm even when observations are made at 100 visual fields in an image analysis. That is, the above means that no large holes basically exist in the ceramic tissue. This may include a case where very small number of holes of 0.1 μm or more in diameter exist under some quite local conditions.

However, even when the semiconductor wafer was attracted by the electrostatic chuck after the ductile worked surface was ultrasonically cleaned, about 25,000 particles were observed on the surface of the semiconductor wafer. It is considered that the reason is probably that ceramic grains or their fragmental pieces peeled from the ceramic substrate are fixedly attached to portions other than the small holes on the ductile worked surface and that the fixedly attached particles cannot be removed by the ultrasonically cleaning.

Taking this fact into account, the present inventors brush cleaning the substrate in a high purity cleaning agent after the ductile worked surface of the substrate having a center line average height of 0.01 μm or less was formed by lapping or the like. In that case, however, about 20,000 particles were observed on the surface of the semiconductor wafer. It is considered that the reason is that particles are separated from the attracting surface by brushing, remained among bristles of the brush or within the cleaning agent and the remaining particles adhered to the attracting surface of the substrate.

Based on the discovery, the present inventors cleaned the attracting surface of the substrate which was constituted by the ductile worked surface, while bringing the ductile worked surface into contact with a cleaning member. Thereafter, the inventors further ultrasonically cleaned the attracting surface of the substrate within high purity cleaning agent. As a result, the inventors succeeded in decreasing the number of particles adhering to the back surface of the semiconductor wafer, after the wafer is contacted with and released from the attracting surface of the electrostatic chuck, to 3000 or less and further to 1000 or less per a 8-inch wafer. In this way, the present invention has been accomplished.

Moreover, the present inventors polished an attracting surface of a substrate and then cleaned the resulting surface within a high purity cleaning agent while rubbing the surface with a cleaning member. Thereafter, ultrasonically cleaning was further conducted within high purity cleaning agent to the surface. As a result, the inventors also succeeded in greatly decreasing the number of particles adhering to the back surface of the semiconductor wafer after the contact between the wafer and the electrostatic chuck.

The inventors studied the reason for the successful result. If the attracting surface is polished until Ra preferably reaches 0.05 μm or less, no small holes as stated above exist at the ductile worked surface mentioned above. However, a processing agent used for the polishing acts as an etching liquid, and forms steps at the ceramic grains exposed to the attracting surface. This will be explained with reference to a schematic view of FIG. 2.

Figure 2:
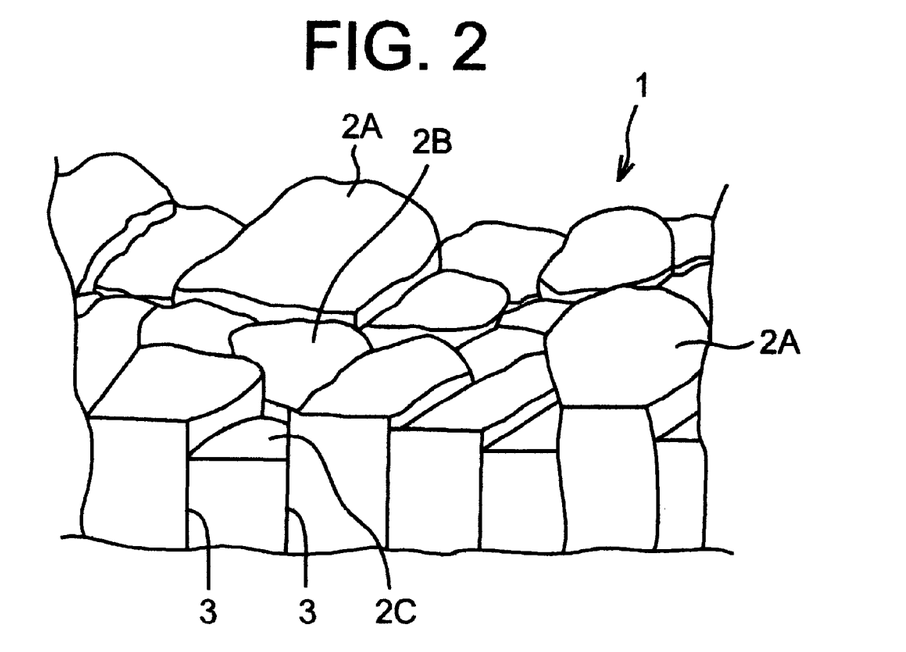
FIG. 2 is a schematic view showing the state of an attracting surface 1 of a substrate polished.

A lot of ceramic grains 2A, 2B and 2C are exposed outside at the attracting surface 1 of the substrate. Since the ceramic grains differ in the direction of crystallographic axis, they differ in etching rate. As a result, height difference occur among the particles 2A, 2B and 2C after polishing, whereby grain boundaries 3 of the ceramic grains appear at the attracting surface 1.

When viewing the attracting surface having such a structure, particles adhere to the surface of each ceramic grain 2A, 2B, 2C. These particles can be removed by rubbing the ceramic grains with a cleaning member.

A part of the particles caught among bristles of the brush of the cleaning member are attached again to the surfaces of the ceramic grains 2A, 2B and 2C. However, it is considered that since those reattached particles have been already once peeled off from the surfaces of the ceramic grains by the cleaning member, the adhering force of the particles to the ceramic grains is so weak that they could be easily removed in the following cleaning step. It is noted, however, that if the height difference among the grains exceeds 0.5 $\mu$m, it becomes difficult to contact the cleaning member with surfaces of the ceramic grains and therefore difficult to remove the particles. It is thus more preferable that the height difference is 0.3 $\mu$m or less, These and other objects, features and advantages of the invention will be appreciated upon reading of the following description of the invention when taken in conjunction with the attached drawings, with the understanding that some modifications, variations and changes of the same could be made by the skilled person in the art to which the invention pertains.

BRIEF DESCRIPTION OF THE DRAWINGS

For a better understanding of the invention, reference is made to the attached drawings, wherein.

DETAILED DESCRIPTION OF THE PREFERRED EMBODIMENTS

In the present invention, the electrostatic chuck is most desirable for the wafer attracting apparatus; however, a vacuum chuck is also available. As the wafer, a semiconductor wafer requiring high purity is most desirable. However, the present invention is also applicable to the iron wafer and the aluminum wafer.

If the present invention is applied to the electrostatic chuck, the shape, etc. of the electrostatic chuck are not limited to specific ones. As a substrate perform of the electrostatic chuck, ordinary substrates to be used for this purpose may be used. That is, the substrate preform may include a ceramic substrate preform prepared by the steps of forming a green molded body preliminarily uniaxially molded in which an electrode is buried and subjecting the green molded body to HP sintering. It is preferable that an electrostatic chuck electrode to be embedded in a ceramic substrate is made of a sheet-shaped bulk metallic material. Here, the "sheet-shaped bulk metallic material" means, for example, a linear bulk body, a planar bulk body or the like in the form of a integrally shaped planar member.

In this case, an electrode for the electrostatic chuck is preferably made of a high melting point metal, since it is fired together with ceramic powder such as alumina powder or aluminum nitride powder. The high melting point metals includes, for example, tantalum, tungsten, molybdenum, platinum, rhenium, hafnium and their alloys. For the viewpoint of preventing the semiconductor wafer from being contaminated, tantalum, tungsten, molybdenum, platinum and their alloys are preferred.

As the above-stated bulk sheet-shaped material, the following can be used:

(1) A sheet-shaped bulk material made of a thin plate.

(2) A sheet-shaped bulk material in which many small void are formed.

The bulk material (2) includes a bulk material made of a planar body having numerous small holes and a net-shaped bulk material. A punched metal may be recited as an example of the planar bulk having numerous small holes. However, if the bulk material is made of a punched metal having a high melting point, it is difficult and highly costly to punch many small holes in the planar high melting point metal because of its high hardness. Compared with this, if the bulk material is to be made of a wire net, wires made of a high melting point metal are so easily available that the metal wire net may be produced by knitting the wires.

The mesh shape, the wire diameter, etc. of such a metal wire are not limited specifically. However, a 150-mesh metal wire net having a wire diameter of 0.03 mm to a 6-mesh metal wire net having a wire diameter of 0.5 mm were practically usable without causing any problem. In addition, the cross-sectional shape in the width direction of the linear material constituting the metal wire net may be circular, elliptical, rectangular or of variously rolled shapes. "One mesh" means one wire per inch.

It is possible to embed a resistive heater and/or a plasma generation electrode as well as an electrostatic chuck electrode in the ceramic substrate constituting the electrostatic chuck.

As the ceramic substrate for constituting a wafer attracting apparatus which is the very target of the present invention, alumna, aluminum nitride, silicon nitride, silicon carbide and the like having a porosity of 95% or more can be recited by way of example. Alumina and aluminum nitride are particularly preferable.

A method for working the attracting surface in the wafer attracting apparatus according to the present invention should not be limited specifically. Preferably, a lapping with abrasive grains made of a hard material, such as diamond, having the average grain diameter or 1 $\mu$m or less or preferably 0.5 $\mu$m or less may be adopted. By this processing, a ductile worked surface having Ra=0.01 $\mu$m or less can be obtained.

The polishing with abrasive grains of silica, cerium oxide or the like having the average grain diameter 2 $\mu$m or less in a neutral or alkaline aqueous solution as a processing liquid diameter may be adopted. By this polishing, it is possible to obtain ductile worked surface having Ra=0.05 µm or less. It is also possible to adopt lapping and polishing in combination.

The same or different high purity cleaning agents may be used for cleaning the ductile worked surface while being rubbed with the cleaning member and ultrasonic cleaning. As the high purity cleaning agent, deionized water having a resistivity of 16 MΩ or less with the number of fine particles in the water being 10/ml or less is preferable, however, an aqueous solution of a surface active agent and an alkaline cleaning agent may be used as well. It is particularly preferable that the temperature of the high purity cleaning agent is set in a range from room temperature to 80° C.

As a cleaning member for cleaning the attracting surface of the substrate of the wafer attracting apparatus, a brushing member is particularly desirable. The material for that brush of the brushing member which directly contacts with the attracting surface of the substrate is preferably polyurethane resin, Teflon resin, polyvinyl alcohol resin called "Bellclean (trademark)" (manufactured by Kanebo Co., ltd.) or the like.

The frequency of ultrasonic waves in the ultrasonical cleaning is not specifically limited. However, it is noted that if the frequency of the waves is not less than 100 kHz but not more than 1000 kHz and the output of the ultrasonic waves is 3.0 to 6.0 W/cm$^2$, the number of particles can be particularly reduced.

(Embodiments)

More detailed experimental results will be explained hereinafter.

(Manufacture of the electrostatic chucks)

A metal wire net made of molybdenum was used as the electrostatic chuck. The wire net is a net obtained by knitting 0.12 mm-diameter molybdenum wires at a rate of 50/inch. Aluminum nitride powder was uniaxially press molded into a disc-like preform. At that time, the wire net was embedded into the preform.

The preform was installed in a mold and sealed in a carbon foil. The preform was fired by hot pressing at a temperature of 1,950° C. under pressure of 200 kg/cm$^2$ for a retention time of two hours, thereby obtaining a sintered body. The relative density of the sintered body was 98.0% or more. The resultant electrostatic chuck was 200 mm in diameter and 8 mm in thickness. The hot pressing firing makes it possible to effectively reduce residual pores and to obtain a sintered body having a relative density of 99.8% or more.

COMPARISOM EXAMPLE 1

An attracting surface of the above-stated electrostatic chuck was lapped. More specifically, the electrostatic chuck was first placed on a copper board (trade name: Hyprez copper manufactured by Japan Engis, Co., Ltd.) and lapped with diamond abrasive grains having the average grain diameter of 6 µm. Thereafter, it was lapped by using diamond abrasive grains of 3 µm in the average grain diameter. The center line average surface height Ra of the lapped surface was measured to be 0.080 µm by a surface roughness meter.

The electrostatic chuck was dipped into deionized water inside a Class 1000 clean room, and subjected to ultrasonic cleaning at a frequency of 730 kHz, an ultrasonic output of 3.7 W/cm$^2$, and a temperature of 25° C. for 5 minutes. Next, the electrostatic chuck was dried with hot air at 130° C. in a clean oven, and then cooled.

Figure 5:
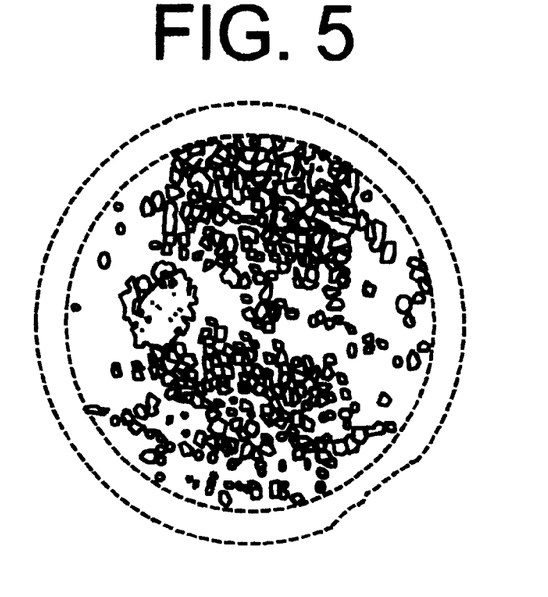
FIG. 5 is a distribution diagram showing the particle distribution on a silicon wafer at a mirror-finished surface side as measured by a particle counter by a light scattering type particle counter in the Comparison Example 1.

A mirror finished surface of a silicon wafer was attracted onto the attracting surface of the electrostatic chuck at 200° C. in air, and the attracted state of the wafer to the electrostatic chuck was released. The number of particles, 0.2 µm or more in diameter, adhering to the mirror finished surface of the silicon wafer was measured by a light-scattering type particle counter. As a result, the number of the particles attached was 94,400. FIG. 5 is a distribution diagram showing particle distribution measured by the light-scattering type particle counter.

Figure 3:
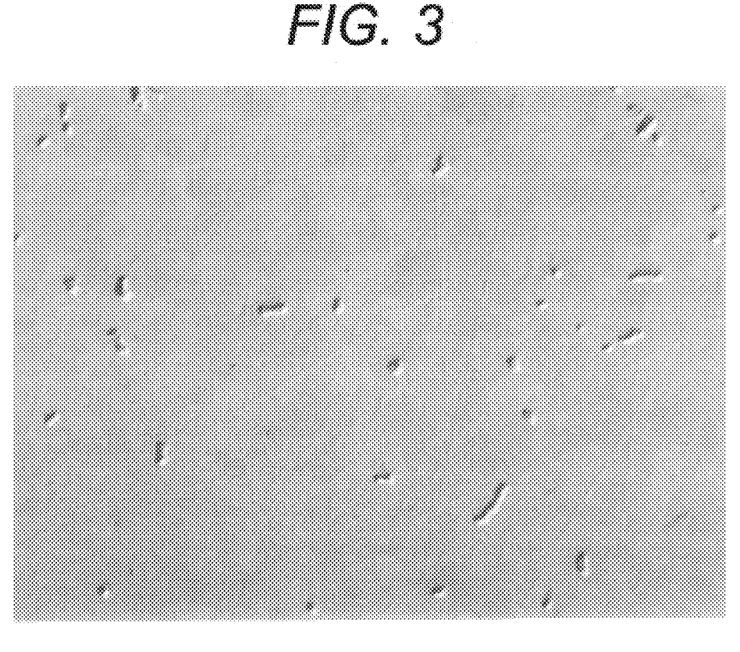
FIG. 3 shows a scanning electron microscopic photograph of the ceramic tissue of an attracting surface of an electrostatic chuck according to Comparison Example 1.

Furthermore, the elemental analysis was made with respect to the particles on the silicon wafer by means of an energy dispersing type spectral analyzer. FIG. 1 shows the analysis result. A scanning electron microscopic photograph of the ceramic tissue of the attracting surface of the electrostatic chuck is shown in FIG. 3. As can be seen from FIG. 3, aluminum nitride particles were separated from the attracting surface. This indicates that the working of the attracting surface is a brittle working involving the separation of aluminum nitride particles.

COMPARISOM EXAMPLE 2

As in the case of Comparison Example 1, an attracting surface of a electrostatic chuck was lapped. Likewise, the attracting surface of the chuck was brushed for 5 minutes in deionized water by using a roll brush made of polyurethane resin inside the Class 1000 clean room. Thereafter, the electrostatic chuck was dried with hot air at 130° C. in the clean oven, and cooled.

With respect to the electrostatic chuck, the number of particles attached to a mirror finished surface of a silicon wafer was measured as in the case of Comparison Example 1. The measurement result was 80,400. The elemental analysis for the particles on the silicon wafer and the ceramic tissue on the attracting surface were similar to those of Comparison Example 1.

COMPARISOM EXAMPLE 3

After manufacturing an electrostatic chuck as described above, the electrostatic chuck was placed on the copper board (trade name: Hyprez copper manufactured by Japan Engis, Co., Ltd.) and lapped with diamond abrasive grains having the average grain diameter of 6 µm. The electrostatic chuck was further lapped with diamond abrasive grains having the average grain diameter of 3 µm. Thereafter, the resulting electrostatic chuck was then placed on a pure tin board and lapped with diamond abrasive grains having the average grain diameter of 0.5 µm. The Ra of the lapped surface was 0.008 µm.

The electrostatic chuck was dipped into deionized water in the Class 1000 clean room, and ultrasonically cleaned at a frequency of 730 kHz, an ultrasonic output of 7 W/cm$^2$ and a temperature of 25° C. for 5 minutes. Next, the electrostatic chuck was dried with hot air at 130° C. in the clean oven, and then cooled.

With respect to the electrostatic chuck, the number of particles adhering to a mirror finished surface of a silicon wafer was measured as in the case of Comparison Example 1. The number of the particles attached was 24,900. The result of the elemental analysis for the particles on the silicon wafer was the same as that of Comparison Example 1.

COMPARISOM EXAMPLE 4

An electrostatic chuck was manufactured as described above, which had a worked surface with the center line average height Ra=0.008 was obtained. The attracting surface of the chuck was brushed in deionized water for 5 minutes with a roll brush of polyurethane resin inside the Class 1000 clean room. Thereafter, the electrostatic chuck was dried with hot air at 130° C. in the clean oven, and then cooled.

With respect to the electrostatic chuck, the number of particles attached to a mirror finished surface of a silicon wafer was measured as in the case of Comparison Example 1. The number of the particles attached was 19,500. The result of the elemental analysis for particles on the silicon wafer was the same as that of Comparison Example 1.

EXAMPLE 1

After manufacturing an electrostatic chuck as described above, the chuck was placed on the copper board (trade name: Hyprez copper manufactured by Japan Engis, Co., Ltd.) and lapped with diamond abrasive grains having the average particle diameter of 6 $\mu$m. The chuck was then lapped with diamond abrasive grains having the average particle diameter of 3 $\mu$m. Furthermore, the electrostatic chuck was placed on a pure tin board and lapped with diamond abrasive grains of 0.5 $\mu$m. The Ra of the lapped surface was 0.008 $\mu$m. The ductile worked surface of the chuck was subjected to image analysis, which revealed that no holes having diameters of 0.1 $\mu$m or more existed in a range of 50 $\mu$m×70 $\mu$m although observed at 100 visual fields.

The attracting surface of the electrostatic chuck was brushed with a roll brush of polyurethane resin in deionized water for 5 minutes inside the Class 1000 clean room. Thereafter, the electrostatic chuck was dipped into deionized water and to ultrasonically cleaned at a frequency of 730 kHz, an ultrasonic output of 3.7 W/cm$^2$, a temperature of 25° C. for 5 minutes. The electrostatic chuck was then dried with hot air at 130° C. in a clean oven, and then cooled.

Figure 6:
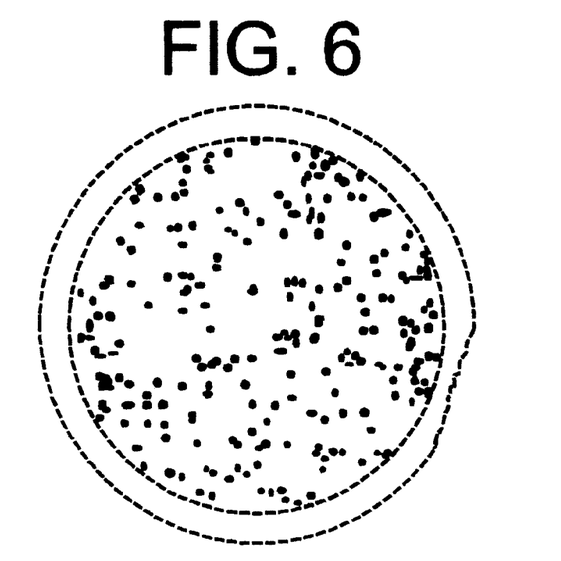
FIG. 6 is a distribution diagram showing the particle distribution on a silicon wafer mirror-finished surface side as measured by the light scattering type particle counter by the light scattering method in the Example 1 according to the present invention.

With respect to the electrostatic chuck, the number of particles attached to a mirror finished surface of a silicon wafer was measured as in the case of Comparison Example 1. The number of the particles attached was 720. As can be understood from this, according to the present invention, the number of particles attached to the mirror finished surface of the silicon wafer could be successfully reduced by about 99% from that of Comparison Example 1. FIG. 6 is a distribution diagram showing the particle distribution measured by the light-scattering type particle counter.

Figure 4:
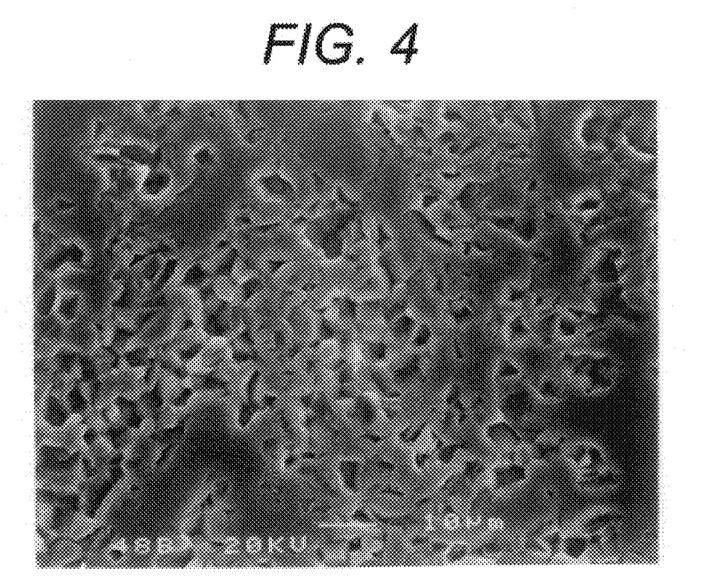
FIG. 4 shows a scanning electron microscopic photograph of a ceramic tissue of an attracting surface of an electrostatic chuck according to the present invention.

A scanning electron microscopic photograph of a ceramic tissue of the attracting surface of the electrostatic chuck is shown in FIG. 4. As is clear from FIG. 4, separation of aluminum nitride grains from the attracting surface was not observed and the ductile surface was seen. The diameters of small holes in the ductile surface were 0.07 $\mu$m or less. It is noted that the small holes are portions in the vicinity of bottom surfaces of holes at which aluminum nitride grains were separated prior to final lapping. The holes could be made smaller thanks to the final lapping.

EXAMPLE 2

Example 2 was the same as Example 1 except that the frequency was 28 kHz and the ultrasonic output was 0.8 W/cm$^2$ at the time in ultrasonic cleaning. As in the case of Example 1, holes having diameters greater than 0.1 $\mu$m did not exist. As a result, the number of particles attached to a mirror finished surface of a silicon wafer was 2,900. Moreover, a scanning electron microscopic photograph of a ceramic tissue of the attracting surface of the electrostatic chuck was the same as that of Example 1.

EXAMPLE 3

Example 3 was the same as Example 1 except that the temperature of deionized water was 80° C. at the time of ultrasonically cleaning. As a result, the number of particles attached to the mirror finished surface of the silicon wafer was 650.

EXAMPLE 4

Example 4 was the same as Example 1 except that an attracting surface of an electrostatic chuck was polished with a solution of cerium oxide abrasive grains having the average grain diameter of 1.8 $\mu$m in Aqueous Lubricant (trade name) manufactured by Nippon Engis Co. Ltd. The Ra of the attracting surface of the electrostatic chuck after polishing was 0.03 $\mu$m. The height difference among ceramic grains at the attracting surface was 0.3 $\mu$m or less. No small holes in the ductile worked surface were present. As a result, the number of particles attached to a mirror finished surface of a silicon wafer was 860.

As can be seen from the above description, the wafer attracting apparatus according to the present invention, which includes the ceramic substrate, can largely decrease the number of particles attaching to the back surface of the wafer after the wafer has been attracted onto the attracting surface of the substrate.

What is claimed is:

1. A substrate for use in a wafer attracting apparatus, said substrate comprises a ceramic material and adapted to attract and hold a wafer onto an attracting surface thereof, wherein said attracting surface comprises a ductile worked surface, the ductile worked surface has concaved portions, a diameter of each of the concave portions is 0.1 $\mu$m or less, and said attracting surface is so non-adherent that when a wafer is attracted onto the attracting surface of the substrate and released from the attracting surface, the number of particles adhering to that wafer is 9.3 or less per 1 cm$^2$.

2. The substrate for use in the wafer attracting apparatus according to claim 1, wherein a center line average surface roughness Ra of the attracting surface of the substrate is 0.01 $\mu$m or less.

3. The substrate for use in the wafer attracting apparatus according to claim 1, wherein said ceramic material is an aluminum nitride sintered body.

4. The substrate for use in the wafer attracting apparatus according to claim 1, wherein an electrode comprising a bulk material is integrally buried in the substrate.

5. A substrate for use in a wafer attracting apparatus, said substrate comprising a ceramic material and adapted to attract and hold a wafer onto an attracting surface thereof, wherein said attracting surface comprises a ductile worked surface, a height different in ceramic grains exposed outside at said attracting surface is formed, said height difference is 0.5 $\mu$m or less, and said attracting surface is so non-adherent that when a wafer is attracted onto the attracting surface of the substrate, the number of particles adhering to that wafer is 9.3 or less per 1 cm$^2$.

6. The substrate for use in the wafer attracting apparatus according to claim 5, wherein said height difference is 0.3 $\mu$m or less.

7. The substrate for use in the wafer attracting apparatus according to claim 5, wherein a center line average surface height Ra of said attracting surface is 0.05 $\mu$m or less.

8. The substrate for use in the wafer attracting apparatus according to claim 5, wherein said ceramic material is an aluminum nitride sintered body.

9. The substrate for use in the wafer attracting apparatus according to claim 5, wherein an electrode comprising a bulk material is integrally buried in the substrate having a monolithic shape.

10. A substrate for use in a wafer attracting apparatus, said substrate being comprising ceramic material and adapted to attract and hold a wafer onto an attracting surface thereof, wherein said attracting surface comprises a ductile worked surface, and when a wafer is attracted onto the attracting surface of the substrate, a maximum roughness Rmax of the ductile worked surface of the substrate is 0.1 $\mu$m or less, and the number of particles adhering to that wafer is 9.3 or less per 1 $cm^2$.

11. The substrate for use in the wafer attracting apparatus according to claim 10, wherein said ceramic material is an aluminum nitride sintered body.

12. A wafer attracting apparatus comprising the substrate set forth in claim 1.

* * * * *